(12) United States Patent
Manger et al.

(10) Patent No.: US 7,141,845 B2
(45) Date of Patent: Nov. 28, 2006

(54) DRAM CELL ARRAY AND MEMORY CELL ARRANGEMENT HAVING VERTICAL MEMORY CELLS AND METHODS FOR FABRICATING THE SAME

(75) Inventors: Dirk Manger, Dresden (DE); Till Schloesser, Dresden (DE); Rolf Weis, Dresden (DE); Bernd Goebel, Dresden (DE); Wolfgang Mueller, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/898,706

(22) Filed: Jul. 23, 2004

(65) Prior Publication Data
US 2005/0083724 A1  Apr. 21, 2005

(30) Foreign Application Priority Data
Jul. 25, 2003  (DE) ................................ 103 34 114

(51) Int. Cl.
*H01L 27/108* (2006.01)
(52) U.S. Cl. ...................................... 257/301; 438/243
(58) Field of Classification Search ........ 438/243–245, 438/386–391, 248; 257/296, 301, 302, 304, 257/350, E27.092, E29.346, E21.396, E21.651, 257/906
See application file for complete search history.

(56) References Cited

U.S. PATENT DOCUMENTS 4,873,560 A  10/1989  Sunami et al.
6,040,210 A  3/2000  Burns, Jr. et al.
6,420,228 B1  7/2002  Roesner et al.
6,426,526 B1  7/2002  Divakaruni et al.
6,537,870 B1  3/2003  Shen
2002/0076880 A1 *  6/2002  Yamada et al. ............. 438/243

FOREIGN PATENT DOCUMENTS

JP  06140597  5/1994

OTHER PUBLICATIONS

IBM Corp., "High Density Cross-Point Cell in an Interleaved Sense Amplifier Layout," IBM Technical Disclosure Bulletin, vol. 30, No. 5, pp. 406-408, (Oct. 1987).

* cited by examiner

*Primary Examiner*—David Vu
(74) *Attorney, Agent, or Firm*—Dicke, Billig & Czaja, PLLC (57) ABSTRACT

Memory cells each having a cell capacitor and a cell transistor, which are arranged in a vertical cell structure, are provided in the cell array of a DRAM. By means of a deep implantation or a shallow implantation and subsequent epitaxial growth of silicon, a buried source/drain layer is formed, from which lower source/drain regions of the cell transistors emerge. The upper edge of the buried source/drain layer can be aligned with respect to a lower edge of a gate electrode of the cell transistor and this results in a reduction of a gate/drain capacitance and also a leakage current between the gate electrode and the lower source/drain region. A body connection plate for the connection of the channel regions is applied to the substrate surface and contact holes are introduced into the body connection plate. Upper source/drain regions of the cell transistors are formed by implantation through the contact holes.

13 Claims, 10 Drawing Sheets

DRAM CELL ARRAY AND MEMORY CELL ARRANGEMENT HAVING VERTICAL MEMORY CELLS AND METHODS FOR FABRICATING THE SAME

CROSS-REFERENCE TO RELATED APPLICATIONS

This Utility Patent Application claims priority to German Patent Application No. DE 103 34 114.5, filed on Jul. 25, 2003, which is incorporated herein by reference.

This Patent Application is also related to Utility patent application Ser. No. 10/897,687, filed on even date herewith, entitled "DRAM CELL ARRAY HAVING VERTICAL MEMORY CELLS AND METHODS FOR FABRICATING A DRAM CELL ARRAY AND A DRAM," and is commonly assigned to the same assignee as the present invention, and which is herein incorporated by reference.

BACKGROUND

The invention relates to a cell array having memory cells arranged in a semiconductor substrate to form cell rows. Each cell has a cell capacitor for storing an electrical charge that characterizes a data content of the memory cell and a cell transistor for selection of the memory cell. Word line trenches are arranged between the cell rows. The cell capacitor is provided in a lower region of a hole trench introduced from a substrate surface of the semiconductor substrate with an inner electrode arranged in the hole trench. The cell transistor is formed in an upper region of the hole trench and has an upper source/drain region, which adjoins the substrate surface and is near the surface, a lower source/drain region, which is connected to the inner electrode of the cell capacitor, and a channel region, which separates the two source/drain regions from one another and is insulated by a gate dielectric from a gate electrode provided in the word line trenches.

The invention furthermore relates to methods for fabricating a cell array and a semiconductor memory device.

Memory cells of dynamic random access memories in each comprise a cell capacitor and a cell transistor. An electrical charge is stored on a storage electrode of the cell capacitor during operation of the memory cell, the value of said charge corresponding to a respective binary data content of the memory cell. Via the cell transistor, the storage electrode is connected to a data line (also called bit line hereinafter) for the purpose of changing or reading out the data content. The cell transistor is a field-effect transistor, the gate electrode of which is connected to a word line by means of which the memory cell is addressed. A first source/drain region of the cell transistor is connected to the bit line and a second source/drain region is connected to the storage electrode of the cell capacitor. By means of a suitable potential at the gate electrode, a conductive channel is formed in a channel or body region between the two source/drain regions, via which channel the storage electrode is connected to the bit line when writing to and reading from the memory cell.

The cell capacitors are provided above or below a transistor plane formed by the cell transistors. In the case of memory cells having cell capacitors formed as hole trench capacitors or trench capacitors, the cell capacitors are formed below the transistor plane in a manner oriented to hole trenches introduced into a semiconductor substrate. The storage electrode is usually provided as an inner electrode within the hole trench and insulated by a capacitor dielectric from an outer electrode formed as a doped region in the semiconductor substrate enveloping the hole trench.

In the case of memory cells embodied in a technology with a minimum feature size of greater than 110 nm, the cell transistors are usually shaped in planar fashion in a manner oriented to a substrate surface of the semiconductor substrate (PTC, planar transistor cell). The source/drain regions of planar cell transistors are provided next to one another below the substrate surface in a manner separated from one another by the channel region. The conductive channel between the two source/drain regions, which can be controlled by the potential at the gate electrode, is essentially formed parallel to the substrate surface.

As a result of progressive reduction of the minimum feature size, it is generally endeavored to increase the performance of DRAMs and to reduce the fabrication costs per memory cell. In the case of memory cells having planar cell transistors, smaller feature sizes lead to shorter channel lengths of the channel formed between the two source/drain regions. In the case of minimum feature sizes of less than 110 nm, a shortening of the channel length corresponding to a miniaturization of the minimum feature size leads to more than proportional difficulties in connection with a lower memory voltage that is then necessary and in the realization of a doping profile of the cell transistor.

Therefore, it is known to orient the cell transistors vertically with respect to the substrate surface in order to decouple the channel length of the cell transistors from the minimum horizontal feature size which can be achieved by the lithographic method respectively used. The two source/drain regions and the channel region lying in between are arranged one above the other. In a vertical memory cell or a memory cell having a vertical cell transistor (VTC, vertical transistor cell), the channel is principally formed in a direction perpendicular to the transistor plane.

Usually, for forming the first source/drain region connected to the bit line, the semiconductor substrate is doped in a region near the surface below the substrate surface by means of an ion implantation that is unmasked in the cell array. The second source/drain region connected to the storage electrode of the cell capacitor is formed by outdiffusion of a dopant from a material introduced into the hole trench at least temporarily through a contact window (buried strap window) in the wall of the hole trench in a section of the semiconductor substrate adjoining the contact window. The buried strap diffusion region has a high dopant concentration in the region of the contact window, said dopant concentration decreasing in the vertical and horizontal directions. If the distance between two memory cells that are adjacent in a cell row is larger than the buried strap diffusion region including a space charge zone formed in their boundary region, then the channel region is connected to a connection structure which, below the buried strap diffusion regions, connects the channel regions of cell transistors arranged to form a cell array to one another with high impedance. A high-impedance connection with a resistivity resulting in the order of magnitude of the intrinsic conduction of the material of the semiconductor substrate generally suffices for avoiding floating body effects during operation of the memory cell. The floating body effect means, for instance, that charge carriers are accumulated in the channel region and a leakage current that discharges the storage electrode is established via a parasitic bipolar transistor structure that is consequently built up.

The gate electrode is provided in a manner corresponding to a region of the hole trench above the cell capacitor in word line trenches between the memory cells arranged in rows (double gate transistor) or both in the word line trenches and in the hole trench (surrounded gate transistor) and is insulated from the channel region by a gate dielectric.

An overlap between the gate electrode and a weakly doped section of the lower source/drain region is advantageous. By contrast, an overlap between the gate electrode and heavily doped sections of the lower source/drain region results in an increased gate/drain capacitance $C_{GD}$, which reduces a switching speed of the cell transistor and thus increases an access time of the DRAM. Moreover, a leakage current path between the buried strap diffusion region and the gate electrode contributes a significant proportion of the total leakage current of the memory cell. A high leakage current disadvantageously increases the access time and the power consumption of the DRAM by virtue of the higher frequency of the refresh cycles that is then required. Furthermore, a high doping in the overlap region results in high local field strengths in the region of the gate dielectric, which impair the reliability thereof.

SUMMARY

One embodiment of the invention provides a cell array and a memory cell arrangement having vertical memory cells for DRAMs with short access times and a low power consumption. Furthermore, one embodiment of the invention specifies a method for fabricating a cell array and a method for fabricating a DRAM with a short access time and a low power consumption.

The cell array in accordance with one embodiment comprises memory cells arranged in a semiconductor substrate to form cell rows. Each cell has a cell capacitor for storing an electrical charge that characterizes a data content of the memory cell and a cell transistor for selection of the memory cell. Word line trenches are provided between the cell rows. The cell capacitor is formed in a lower region of a hole trench introduced from a substrate surface of the semiconductor substrate and has an inner electrode arranged within the hole trench. A semiconductor body of the cell transistor, which comprises an upper and a lower source/drain region and also a channel region, is formed in the semiconductor substrate in a manner oriented to an upper region of the hole trench. The upper source/drain region of the cell transistor adjoins the substrate surface in a section of the semiconductor substrate near the surface. The lower source/drain region is electrically conductively connected to the inner electrode of the cell capacitor. The two source/drain regions are formed as doped regions of a first conductivity type and are separated from one another by the channel region. The channel region is not doped or has a weak doping of a second conductivity type opposite to the first conductivity type. A gate dielectric insulates the channel region from a gate electrode provided in the word line trenches.

According to one embodiment of the invention, the lower source/drain regions of the cell transistors in each case comprise sections of a buried source/drain layer perforated by the hole trenches and the word line trenches. A horizontal doping profile and a vertical doping profile of the lower source/drain region are thus decoupled from one another. In the cell array, the source/drain layer has a doping profile that is location-independent in the horizontal direction.

In conventional vertical cell transistors, the lower source/drain region is formed solely by outdiffusion of a dopant from the interior of the hole trench through a contact window in an insulator structure, which insulates the inner electrode from the semiconductor substrate enveloping the hole trench, in a section of the semiconductor substrate adjoining the contact window. The doping profile of the buried strap diffusion region is dependent in the vertical and horizontal directions on a thermal budget to which the cell structure is exposed in the course of fabrication of a DRAM. The spatial position and the extent of the lower source/drain region are determined by the form and position of the contact window, by the distribution of the dopant in the starting material, and by the thermal budget. In particular, the doping profile in the vertical direction and the doping profile in the horizontal direction are linked to one another. The extent of a section in which the lower source/drain region has a relatively heavy doping in the vertical direction is dependent on the tolerances of a multiplicity of process steps for instance for forming the contact window. Consequently, an overlap region between the heavily doped section of the lower source/drain region and the gate electrode arranged in the word line trenches results, which disadvantageously leads to a longer access time and/or to a higher leakage current.

The source/drain layer according to one embodiment of the invention decouples the geometry of the lower source/drain region from the geometry of the buried strap diffusion region. The function of the buried strap diffusion region is essentially limited to producing a low-impedance connection between the inner electrode and a section of the source/drain layer assigned to the respective memory cell. The functionality of the lower source/drain region is principally determined by the respective section of the source/drain layer. The distances between upper edge and lower edge of the lower source/drain regions of the cell transistors arranged in the cell array with respect to the substrate surface have only small deviations from one another owing to the formation as sections of the source/drain layer over the entire cell array.

The channel regions and the upper source/drain regions of the cell transistors are formed in an epitaxially grown layer of the semiconductor substrate. This results, over the entire cell array, in a uniform distance between the upper edge of the lower source/drain region and the substrate surface, and thus between the lower source/drain region and a lower edge of the gate electrode.

In one embodiment, at least one upper section of the buried source/drain layer is formed in the epitaxially grown layer of the semiconductor substrate. A doping profile that is independent of diffusion processes to a greater degree and can be better controlled then results in the transition region between the buried source/drain layer and the channel region and thus in the region of overlap with the gate electrode.

In one embodiment, the memory cells in each case have a buried strap diffusion region formed as a doped region of the first conductivity type in the semiconductor substrate. The buried strap diffusion region adjoins the inner electrode in the region of a contact window and overlaps or penetrates the section of the buried source/drain layer assigned to the respective memory cell. The buried strap diffusion region reduces an electrical resistance between the inner electrode of the cell capacitor and the lower source/drain region of the cell transistor.

The buried strap diffusion region is formed such that the upper edge of the lower source/drain region is determined by the upper edge of the buried source/drain layer.

If the gate electrodes of memory cells that are adjacent within a cell row are connected to form word lines running along sidewalls of the word line trenches, then it is advantageous that, correspondingly, a lower edge of the word lines is provided above the upper edge of the buried strap diffusion region and below the upper edge of the buried source/ drain layer. This reduces a proportion of a leakage current path between the lower source/drain region and the word line, or the gate electrode, in the total leakage current of the memory cell since the magnitude of the proportion is proportional to a dopant concentration in the section of the lower source/drain region which overlaps the gate electrode.

The channel region is undoped or has a counterdoping of the second conductivity type.

In one embodiment, the formation of the lower source/drain regions as sections of a layer that is merely by the hole trenches and the word line trenches means that the channel regions of the cell transistors can no longer readily be electrically connected to a connection structure that is to be provided below the lower source/drain regions. In order to avoid a patterning of the lower source/drain layer, it is advantageous if the channel regions adjoin the substrate surface in sections and are connected to a conductive connection structure formed above the substrate surface.

A memory cell arrangement according to one embodiment of the invention has a cell array of memory cells. The memory cells are in each case formed in the region of a hole trench introduced into a semiconductor substrate from a substrate surface. A cell capacitor for storing an electrical charge that characterizes a data content of the memory cell is formed in a lower region of the hole trench. The electrical charge is read out or brought to an inner electrode provided within the hole trench via a source/drain path between two source/drain regions of a cell transistor. The cell transistor has a source/drain region which adjoins the substrate surface and is connected to a bit line and is near the surface.

A lower source/drain region is connected to the inner electrode of the cell capacitor. The two source/drain regions are separated from one another by a channel region that adjoins the substrate surface in sections.

The channel region is insulated by a gate dielectric from a gate electrode connected to a word line. In the channel region, a channel that temporarily connects the two source/drain regions to one another is controlled by a potential at the gate electrode. The word lines are arranged in rows in word line trenches below the substrate surface. The bit lines are provided above the substrate surface and run parallel to the substrate surface and perpendicular to the word lines. The channel regions are connected to one another above the substrate surface.

According to one embodiment of the invention, a body connection plate that bears on the substrate surface is provided in the cell array and is electrically conductively connected to the channel regions adjoining the substrate surface in sections. In comparison with known memory cell arrangements, the need to pattern body connection lines for the connection of the channel regions is obviated.

In the case of a known concept for a connection of the channel regions from "above", that is, past the upper source/drain regions, the word lines are provided above the substrate surface. Body connection lines which connect the channel regions of cell transistors to one another in columns perpendicularly to the cell row are then formed in a self-aligned manner with respect to the word lines running parallel.

By contrast, if the word lines are provided below the substrate surface, then the possibility of forming the body connection lines in a self-aligned manner with respect to the word lines is obviated. The additional step for patterning the body connection lines, which is then usually necessary, can be obviated according to one embodiment of the invention. For this purpose, the body connection plate is formed as a perforated layer made of a conductive material that covers the cell array, bears on the substrate surface and is perforated by electrically insulated contact holes for the connection of the upper source/drain regions to the bit lines. A charge carrier transport is effected areally and does not disadvantageously cumulate in a rowwise or columnwise manner.

In one embodiment, the body connection plate is provided from polysilicon and has a doping of the second conductivity type, which is opposite to the first conductivity type of the source/drain regions. Besides a reduced electrical resistance of the body connection plate, this results in the possibility of forming, by outdiffusion from the body connection plate, in each case a body contact diffusion region as a doped region of the second conductivity type in a section of the channel region adjoining the substrate surface.

The body contact diffusion region enables or improves a transporting away of charge carriers from the channel region.

In one embodiment, a nitrided boundary layer is provided between the channel region and the body connection plate in order to avoid a disruption of the crystal structure of the semiconductor substrate due to ingrowth of grain boundaries from the polysilicon of the body connection plate.

In one embodiment, the regions of the first conductivity type are n-doped. The cell transistors are then n-channel field-effect transistors, which are simpler to fabricate compared with p-channel field-effect transistors with comparable functionality.

In accordance with the method according to one embodiment of the invention for fabricating a cell array having memory cells arranged in memory cell rows in a semiconductor substrate, the memory cells are provided with in each case a cell capacitor for storing an electrical charge that characterizes a data content of the memory cell and a cell transistor for selection of the memory cell. For this purpose, firstly hole trenches are introduced into the semiconductor substrate from a substrate surface. An inner electrode of the cell capacitor is in each case provided in a lower section of the hole trenches. An outer electrode of the cell capacitor is formed in the semiconductor substrate enveloping the hole trench in the lower section. A capacitor dielectric is provided between the inner electrode and the outer electrode. The cell transistor is in each case provided in a manner oriented to an upper section of the hole trench in that a lower source/drain region adjoining the inner electrode, an upper source/drain region adjoining the substrate surface and a channel region separating the source/drain regions from one another are formed in each case in the semiconductor substrate adjoining the hole trench. The channel region is insulated by a gate dielectric from a gate electrode which is formed at least partially as a section of a word line provided in word line trenches introduced between the cell rows. The upper source/drain region is connected to a bit line.

According to one embodiment of the invention, the lower source/drain region is at least partially formed as a buried source/drain layer perforated by the hole trenches and the word line trenches.

In a first embodiment of the method according to the invention, the buried source/drain layer is formed by a deep ion implantation with a dopant of a first conductivity type into the semiconductor substrate.

An ion implantation with a dopant of a second conductivity type opposite to the first conductivity type is performed in a layer forming the channel regions in the cell array, in order to define the doping profile in a transition region between the lower source/drain region and the channel region.

According to a second embodiment of the method according to the invention, in a first step, a shallow ion implantation is performed in the region of the cell array. In a second step, at least the sections of the semiconductor substrate that are to be provided above the buried source/drain layer are grown epitaxially. This results in a well-alignable upper edge of the buried source/drain layer in the cell array.

The cell capacitor is provided with a contact window, in the region of which the inner electrode adjoins the semiconductor substrate. A buried strap diffusion region that adjoins the inner electrode and at least partially overlaps the buried source/drain layer and penetrates this is formed by outdiffusion of a dopant of the first conductivity type from the interior of the hole trench through the contact window in the semiconductor substrate. The buried strap diffusion region reduces a contact resistance between the inner electrode and the lower source/drain region. In this case, the outdiffusion is controlled such that the properties of the lower source/drain region, apart from the contact resistance with respect to the inner electrode, are determined by the buried source/drain layer, which can be produced more variably and more precisely in comparison with the outdiffusion.

One embodiment of the lower source/drain regions as sections of a source/drain layer extending through the cell array makes it more difficult to make contact with the channel region proceeding from a connection structure provided below the lower source/drain regions. A method for forming body connection lines above the substrate surface is furthermore known, in which only the channel regions of cell transistors that are adjacent on a line transversely with respect to the cell row are connected to one another. Since a charge carrier transport is effected via the comparatively high-impedance body connection lines, the compensating current accumulates within the body connection line, so that differing conditions with regard to a charge in the channel region result for the memory cells connected by the body connection lines.

The buried source/drain layer according to one embodiment of the invention therefore leads to a method according to the invention for fabricating a memory cell arrangement having memory cells each having a cell capacitor for storing electrical charge in accordance with a data content of the memory cell and a cell transistor for addressing the memory cell in a semiconductor substrate, in addition to the upper source/drain regions, the channel regions are also connected above a substrate surface of the semiconductor substrate.

For this purpose, hole trenches arranged to form cell rows from a substrate surface are introduced into the semiconductor substrate, the cell capacitor being formed in a manner oriented to a lower section of the hole trench and the cell transistor being formed in a manner oriented to an upper section of the hole trench. A semiconductor body of the cell transistor comprising an upper and a lower source/drain region and also a channel region is formed in the semiconductor substrate, the lower source/drain region being connected to one of the electrodes of the cell capacitor. The upper source/drain region is provided in a manner adjoining the substrate surface. The channel region separating the two source/drain regions likewise adjoins the substrate surface in sections. The upper source/drain region is connected to a bit line and the channel region is connected to a substrate connection. Word lines for controlling a potential at the gate electrodes are arranged below the substrate surface in word line trenches introduced from the substrate surface between cell rows formed by the memory cells.

According to one embodiment of the invention, a body connection plate is applied to the substrate surface prior to the formation of the upper source/drain regions in the region of the cell array. Contact holes are introduced into the body connection plate and are electrically insulated from the body connection plate. By means of an implantation with a dopant corresponding to the conductivity type of the upper source/drain regions, the upper source/drain regions are formed as doped regions through the contact holes and in a manner masked by the body connection plate in sections of the semiconductor substrate adjoining below the contact holes. The upper source/drain regions are thus formed in a self-aligned manner with respect to the contact holes which are provided for connecting the upper source/drain regions to the bit line. Only a relatively noncritical patterning of the bit lines with respect to the contact holes is effected in a bit line plane adjoining above the body connection plate. The connection of the channel regions does not require an additional critical lithographic mask.

In one embodiment, the body connection plate is provided from polysilicon. The semiconductor substrate is nitrided prior to the application of the body connection plate in the cell array in the region of the substrate surface, in order to avoid a disruption of the crystal lattice of the semiconductor substrate due to ingrowth of grain boundaries of the polysilicon.

In one embodiment, polysilicon doped by the second conduction type is provided as the material of the body connection plate and a body contact diffusion region is formed by outdiffusion from the doped polysilicon in the section of the channel region that adjoins the body connection plate below the substrate surface, which body contact diffusion region reduces a contact resistance between the channel region and the body connection plate.

In connection with a method for fabricating a semiconductor memory device, for instance a DRAM, having a cell array having memory cells for storing data and a control transistor region for controlling the cell array, in which p-channel field-effect transistors with a gate electrode made of polysilicon are provided in the control transistor region, a particular advantage is afforded according to the invention when the cell array is formed in accordance with the method already described and, in this case, the application of the body connection plate in the cell array is effected in one process together with an application of the gate electrode material of the p-channel field-effect transistors in the control transistor region. The application of the body connection plate does not then require an additional process step.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
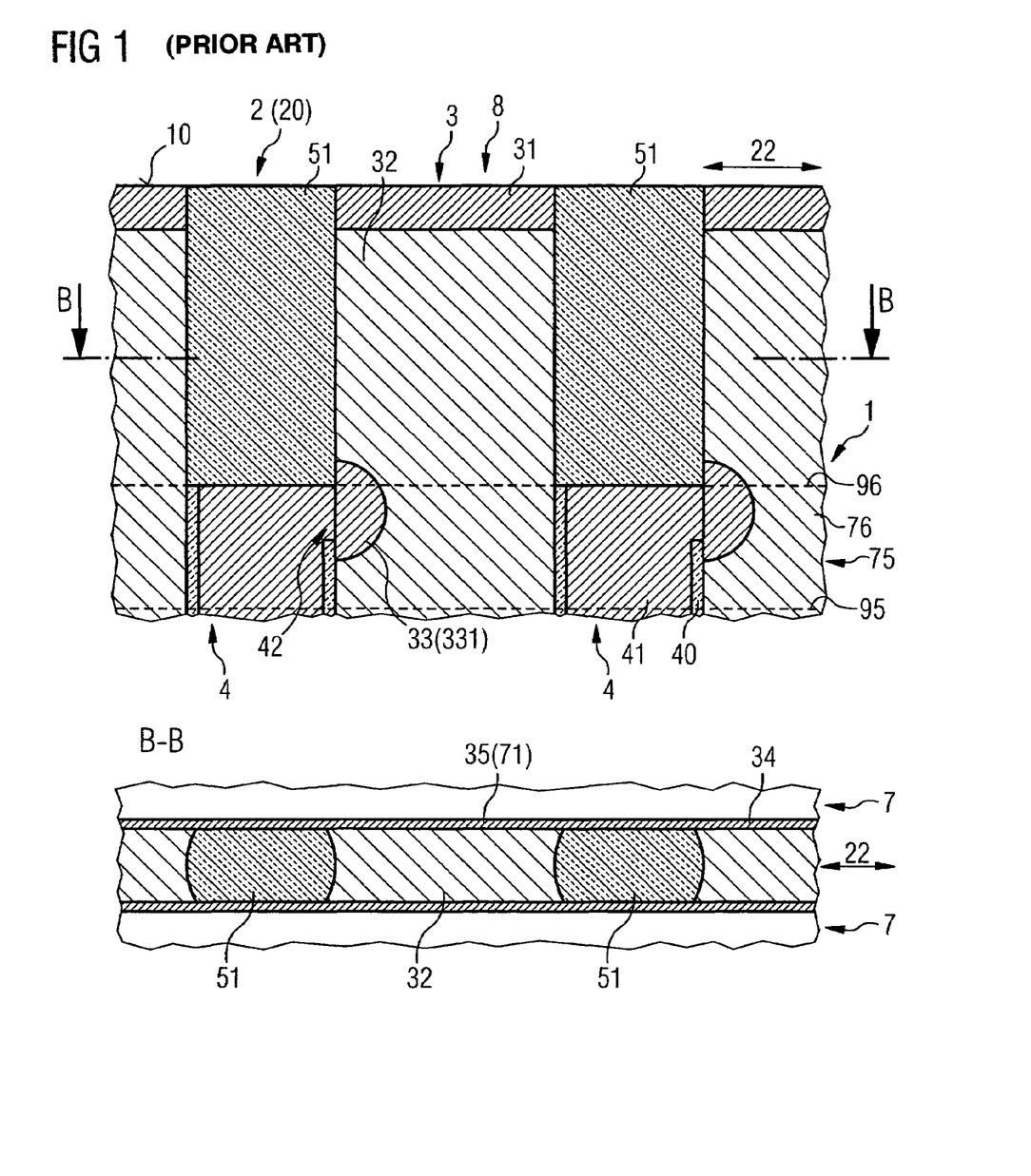
FIG. 1 illustrates a diagrammatic longitudinal section through and a simplified plan view of a cell array along a cell row with cell transistors having a lower source/drain region formed by a buried strap diffusion region according to a first prior art.

FIG. 1 illustrates a cell array of a DRAM having vertical memory cells 2. The memory cells 2 are in each case oriented to hole trenches 20 introduced into a semiconductor substrate 1 from a substrate surface 10. A cell capacitor 4 of the memory cell 2 comprises an outer electrode, which is formed as a doped region in a section of the semiconductor substrate 1 outside the region illustrated which envelopes the hole trench 2 in a lower region. The outer electrodes of the cell capacitors are connected to one another and connected to a common reference potential. In the lower region, an inner electrode 41 is arranged within the hole trench 2. The inner electrode 41 is insulated outside the illustrated region by a capacitor dielectric from the outer electrode and above the outer electrode by a sidewall insulator 40 from sections of the semiconductor substrate 1 enveloping the inner electrode 41 above the outer electrode. The sidewall insulator 40 is caused to recede asymmetrically in the region of a contact window 42. The contact window 42 is adjoined by a buried strap diffusion region 331, which is n-doped in the semiconductor substrate 1 and functionally forms a lower source/drain region 33 of the cell transistor 3. An upper source/drain region 31 of the cell transistor 3 is formed as a section of an n-doped layer perforated by the hole trenches 20 and is connected to a bit line that is to be provided above the substrate surface 10. The two source/drain regions 31, 33 are spaced apart from one another by a channel region 32. In this exemplary embodiment, the hole trench 20 is filled with an insulator structure 51 in the region of the cell transistor 3. A plurality of memory cells 2 are arranged at identical distances within a cell row 22.

Adjacent cell rows 22 are isolated from one another by word line trenches 7 introduced from the substrate surface 10. Strands of word lines 71 are arranged on sidewalls of the word line trenches 7. Two strands of word lines 71 lie opposite one another at the cell row 22, and, in the case of the cell transistor 3 being formed as a double gate transistor, are strands of the word line 71 assigned to the cell transistor 3. A gate electrode 35 is then formed as a section of the word line 71 running in two strands along the cell row 22 and is insulated from the semiconductor substrate 1 and the channel region 32 by a gate dielectric 34.

A potential at the gate electrode 35 controls the formation of a conductive channel between the two source/drain regions 31, 33 in the channel region 32. By means of the conductive channel, the inner electrode 41 of the selected cell capacitor 4 is connected to a bit line which adjoins the upper source/drain region 31 and via which an electrical charge is passed to the inner electrode 41 or via which a magnitude of a charge stored on the inner electrode 41 is determined and assessed.

The channel region 32 is connected to a connection structure 75 below the lower source/drain region 33, a suitable potential being applied to said connection structure, for its part, during operation of the cell array. For this purpose, a sufficient distance has to be provided in each case between two hole trenches 20. The distance is dimensioned such that a connecting section 76 which is formed between the lower source/drain region 33 of a first memory cell and a hole trench 20—adjacent in the cell row 22—of the adjacent memory cell 2 and through which charge carriers can be led away from the channel region 32 is pinched off neither by the lower source/drain region 33 nor by a space charge zone established around the lower source/drain region 33. The dimensions and position of the lower source/drain region 33 depend on the position and form of the contact window 42.

A significant proportion of a leakage current of the memory cell 2 is supplied by a leakage current path established in an overlap region between the buried strap diffusion region 331 and the gate electrode 35 from the inner electrode 41 to the word line 71. The overlap region also determines the magnitude of a gate/drain capacitance $C_{GD}$ that determines the switching time of the cell transistor. Furthermore, a high doping in the overlap region, during operation of the memory cell 2, is the cause of a locally high electric field strength which adversely influences the reliability of the memory cell 2.

Figure 2:
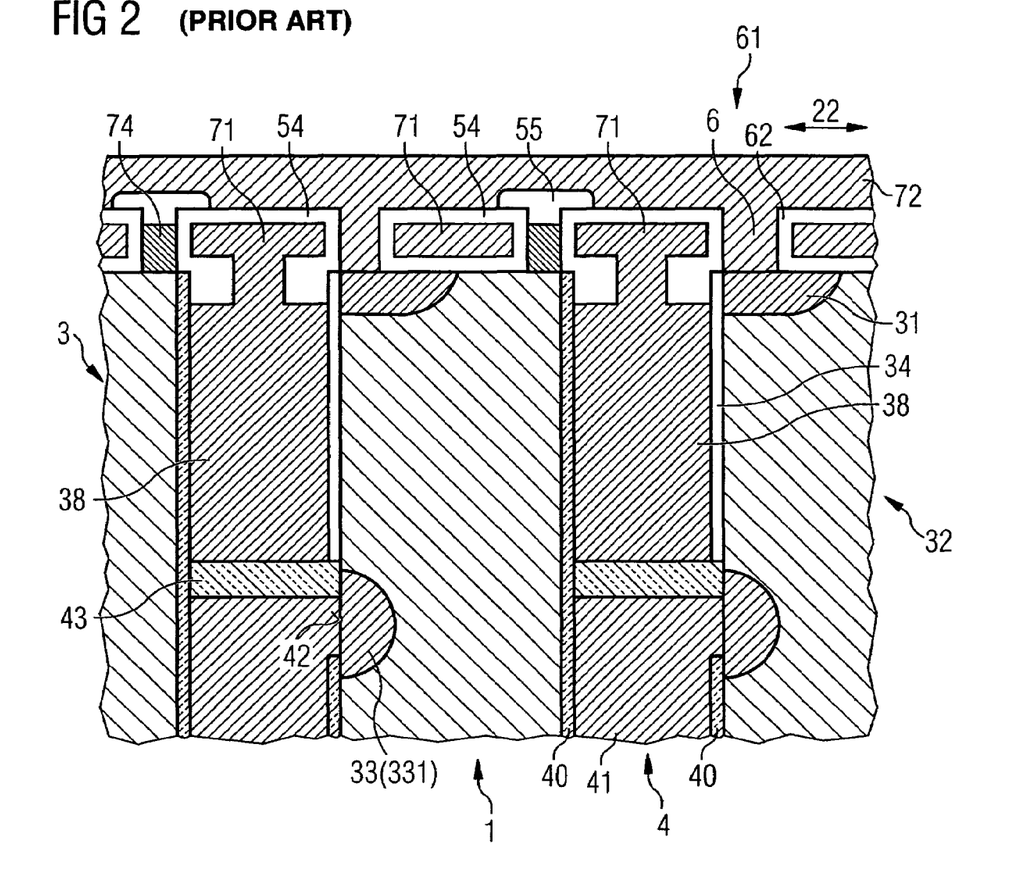
FIG. 2 illustrates a diagrammatic longitudinal section through a memory cell arrangement along a cell row with a contact-connection of channel regions of cell transistors according to a second prior art.

In contrast to the cell array described with reference to FIG. 1, in the case of the memory cell arrangement illustrated in FIG. 2, the gate electrodes are arranged as trench gate electrodes 38 within the hole trenches 2 and are insulated by a capacitor termination 43 from the inner electrode 41 of the cell capacitor 4. The trench gate electrodes 38 are connected to word lines 71 arranged above the substrate surface 10. The gate dielectric 34 is provided on a front side between the semiconductor substrate 1 and the gate electrode 38. On the rear side opposite to the front side, an insulator structure 40 that insulates the inner electrode 41 in the upper region of the cell capacitor 4 from the semiconductor substrate 1 enveloping the hole trench 20 is drawn up on one side as far as the substrate surface 10.

Furthermore, in contrast to the cell array already described, in each case in the region between two hole trenches 20, both the upper source/drain region 31 and the channel region 32 of the cell transistor 3 adjoin the substrate surface 10. The upper source/drain region 31 is connected to a bit line 72. The channel region 32 is connected to a body connection interconnect 74. The body connection line 74 is insulated from the bit line by an insulator covering 55. The word lines 71 are insulated from one another, from the semiconductor substrate 1, from the bit line 72 and from the body connection line 74 by an insulator encapsulation 54.

The channel regions 32 of cell transistors 3 that are adjacent in a direction orthogonal to the cell row 22 are connected to one another via the body connection line respectively running between two word lines 71. The charge carriers that are led away accumulate within the relatively high-impedance body connection line, so that different conditions result for transporting away the charge carriers of memory cells 2 connected in this way, depending on the position of the memory cell 2 within the cell row 22.

FIGS. 3–6 illustrate a memory cell arrangement according to the invention having memory cells 2.

Figure 3:
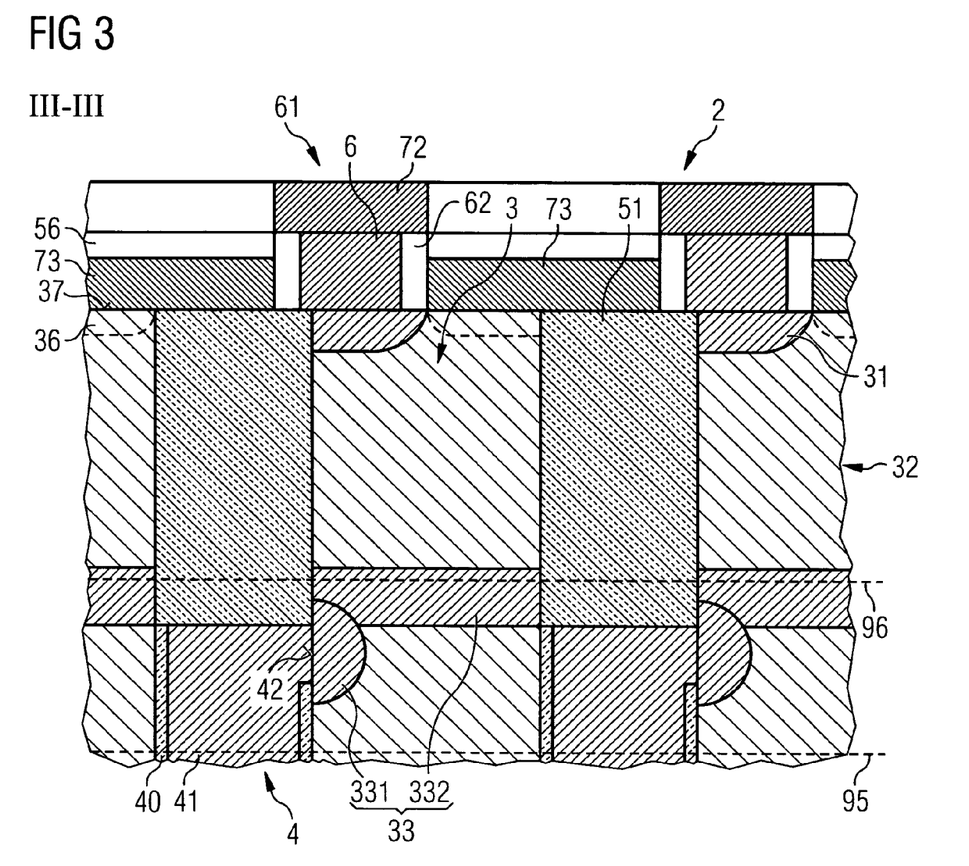
FIG. 3 illustrates a diagrammatic longitudinal section through a memory cell arrangement according to the invention in accordance with a first exemplary embodiment along a cell row.

In this case, FIG. 3 illustrates a longitudinal section through a cell row 22. In contrast to the cell array illustrated in FIG. 1 as prior art, the lower source/drain regions 33 comprise sections of a source/drain layer 332 perforated by the hole trenches 2 and the word line trenches 7. The word line trenches 7 extend between the substrate surface 10 and a lower edge 95 of the word line trenches. The source/drain layer 332 determines a doping profile, and also the position and extent of the lower source/drain region 33. Via the buried strap diffusion region 331, the lower source/drain region 33 is connected to the inner electrode 41 of the cell capacitor 4, which inner electrode is insulated from the semiconductor substrate 1 by a sidewall insulator 40 in an upper region of the cell capacitor 4.

The source/drain layer 332 makes it more difficult for the channel region 32 to be contact-connected to a section of the semiconductor substrate 1 adjoining below the lower source/drain regions 33.

Therefore, the channel region 32 is contact-connected by a body connection plate 73 bearing on the substrate surface 10 in the cell array. A nitrided interface layer 37 and/or a body contact diffusion region 36 reduces a contact resistance between the body connection plate 73 and the channel region 32. The body connection plate 73 is perforated by contact holes 61. Bit line contacts 6 insulated from the body connection plate 73 by spacer insulators 62 are provided in the contact holes 61, via which bit line contacts the upper source/drain regions are connected to the bit lines 72. In contrast to the prior art illustrated in FIG. 2, a reduced reciprocal influencing of the memory cells 2 of the cell array results by virtue of the areal transporting away of the charge carriers from the channel region 32 in a plurality of directions.

Figure 4:
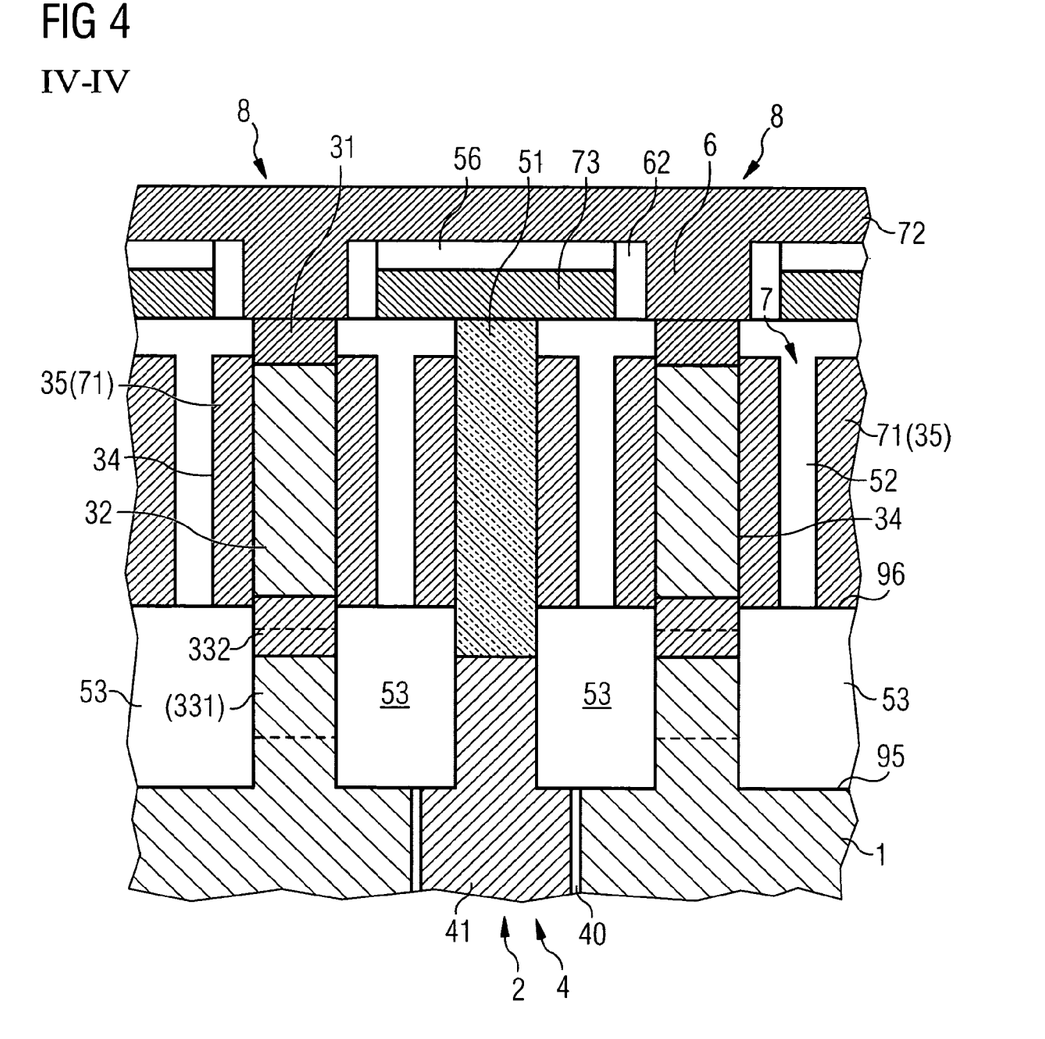
FIG. 4 illustrates a diagrammatic cross section through the memory cell arrangement according to the invention as illustrated in FIG. 3 transversely with respect to the cell rows.

FIG. 4 illustrates a cross section transversely with respect to the cell rows 22. The cell rows 22 are isolated from one another by the word line trenches 7. The depth or a lower edge 95 of the word line trenches 7 is determined such that in particular the lower source/drain regions 33 of cell transistors 3 that are adjacent transversely with respect to the cell rows 22 are insulated from one another. The hole trenches 20 of respectively adjacent cell rows 22 are arranged offset relative to one another by in each case half the distance between the center points of the hole trenches (pitch). The cross section intersects, in the center of FIG. 4, a cell row 22 in the region of the hole trench 2 and besides that two further cell rows 22 in each case in the region of a semiconductor web 8 which is bounded by two hole trenches 2 and in which are formed the source/drain regions 31, 33 as n-doped regions and also the undoped or weakly p-doped channel region 32 of the cell transistor 3.

A respective strand of a word line 71 runs in the two word line trenches 7 bounding the cell row 22, which strand in each case forms, in sections, one of two portions of a gate electrode 35. The two portions of the gate electrode 35 enclose the channel region 32 on both sides.

A row insulator 53 is provided in a region that extends between the lower edge 95 of the word lines 71 and the lower edge 95 of the word line trenches 7, said row insulator defining a lower edge of the word lines 7 or the gate electrodes 35 relative to the upper edge of the buried strap diffusion region 331 and the source/drain layer 332.

Figure 5:
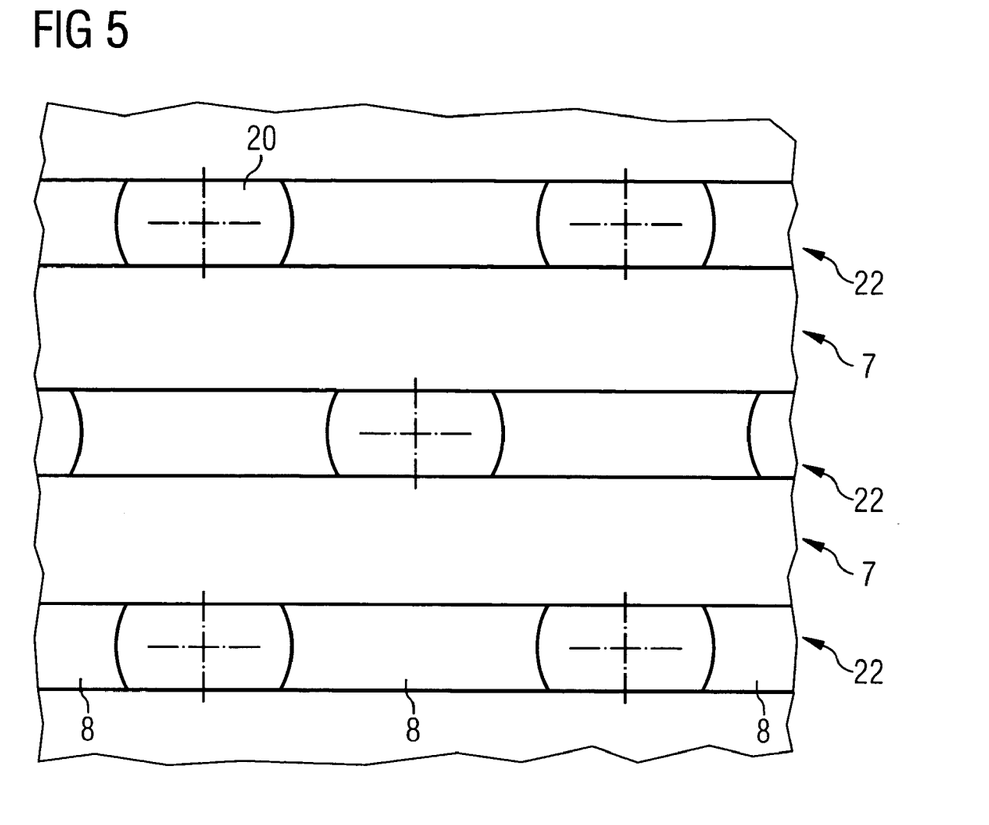
FIG. 5 illustrates a diagrammatic cross section through the memory cell arrangement according to the invention as illustrated in FIG. 3 and FIG. 4 parallel to the substrate surface.

The cell array respectively illustrated in longitudinal section and cross section in FIGS. 3 and 4 is illustrated in a plan view of the substrate surface 10 in FIG. 5.

The hole trenches 20 are arranged offset relative to one another in respectively adjacent cell rows 22 by half the distance between the center points of two hole trenches 20 that are adjacent within a cell row 22. The cell rows 22 are isolated from one another by word line trenches 7. Within the cell rows 22, two hole trenches 20 in each case bound a semiconductor web 8 that forms a semiconductor body of the cell transistor 3 with the source/drain regions 31, 33 and the channel region 32.

Figure 6:
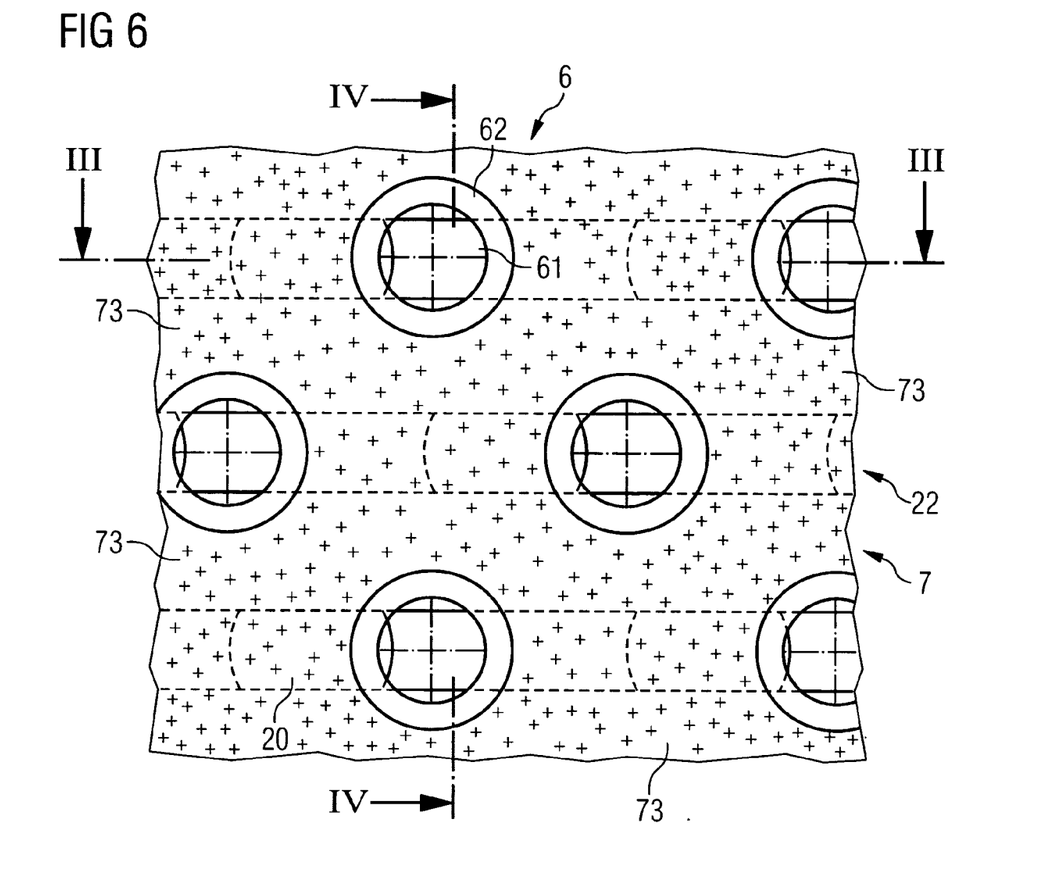
FIG. 6 illustrates a diagrammatic plan view of the memory cell arrangement according to the invention as illustrated in FIG. 3 and FIG. 4.

The memory cell arrangement illustrated in FIG. 6 is based on the cell array of FIG. 5, the structure of which comprising hole trenches 20 and word line trenches 7 is reproduced by broken lines. The memory cell arrangement is illustrated in a cross section parallel to the substrate surface. A body connection plate 73 perforated by contact holes 61 bears on the substrate surface. Through the contact holes 61, the upper source/drain regions 31 are formed as doped regions in the semiconductor substrate 1 by means of implantation. A bit line contact 6 insulated from the body connection plate 73 by spacer insulators 62 is in each case provided in the contact holes 61. The bit line contacts 6 connect the upper source/drain regions 31 to bit lines that are arranged above the body connection plate 73 and are insulated from the latter.

Outside the cell array, the body connection plate 73 is connected to a suitable auxiliary potential at a plurality of locations. The areal formation of the body connection plate 73 makes it possible for charges to be led away from the channel regions 32 at relatively high impedance in accordance with a resistivity in the region of the intrinsic conduction of the material of the semiconductor substrate 1 and with little reciprocal influencing of the memory cells 2.

Figure 7A:
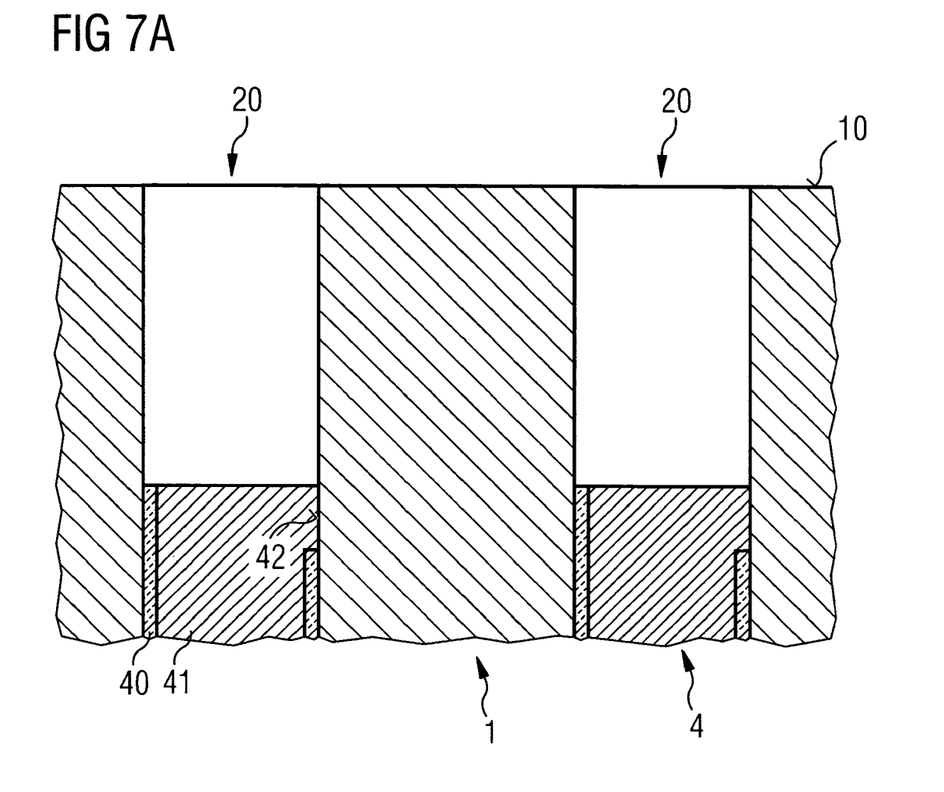
FIGS. 7A to 7B illustrate diagrammatic cross sections through a cell array along a cell row in two stages of a first exemplary embodiment of the method according to the invention.
Figure 7B:
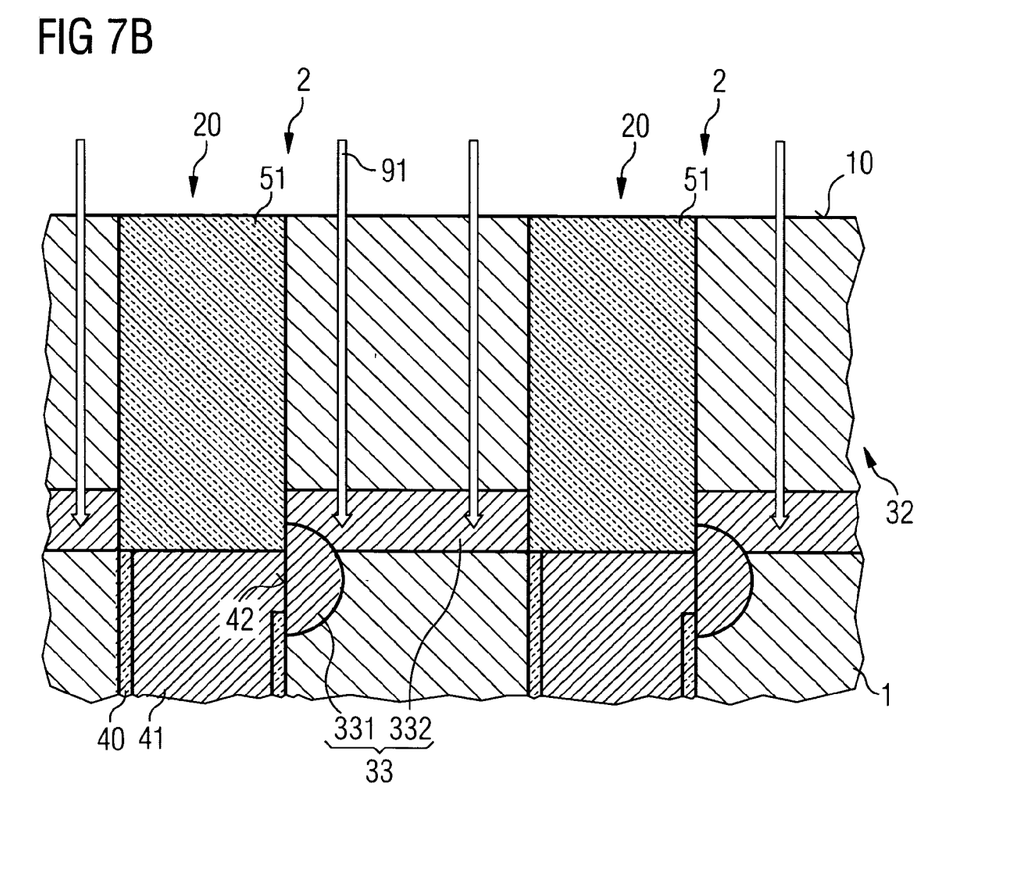

In accordance with the exemplary embodiment illustrated in the two drawings of FIG. 7, for a first exemplary embodiment of the method according to the invention, firstly a hole trench 20 is introduced into a semiconductor substrate 1 from a substrate surface 10 for each memory cell. A cell capacitor 4 with an inner electrode 41 is provided in a lower region of the hole trench 20. In the region illustrated, the inner electrode 41 is insulated by a sidewall insulator 40 from the semiconductor substrate 1 enveloping the hole trench 20. In this case, the sidewall insulator 40 is caused to recede on one side, so that the inner electrode 41 adjoins the semiconductor substrate 1 in the region of a contact window 42.

FIG. 7A illustrates two hole trenches 20 in the semiconductor substrate 1, within each of which the inner electrode 41 is provided in a lower region, which inner electrode, in the section illustrated, adjoins the semiconductor substrate 1 in the region of the contact window 42 and, outside the contact window 42, is insulated from the enveloping semiconductor substrate 1 by the sidewall insulator 40.

Afterward, a source/drain layer 332 is produced as an n-doped region by means of a deep implantation 91 in the region of the cell array. In this case, the deep implantation may comprise a plurality of implantation steps having different implantation energy in order to optimize a doping profile in the vertical direction. A buried strap diffusion region 331 is produced by outdiffusion of a dopant from the inner electrode 41 or from a temporary filling of the hole trench 20 at the place thereof, said buried strap diffusion region penetrating the source/drain layer 332 in sections.

In accordance with FIG. 7B, a respective section of the source/drain layer 331 forms the essential portion of the lower source/drain region 33 of a cell transistor 3. The lower source/drain region 33 is connected to the inner electrode 41 with low impedance by the buried strap diffusion region 331. A channel region 32 that spaces the two source/drain regions 31, 33 apart from one another may have a p-type counterdoping which contributes to the alignment of an upper edge of the source/drain layer 331.

Figure 8A:
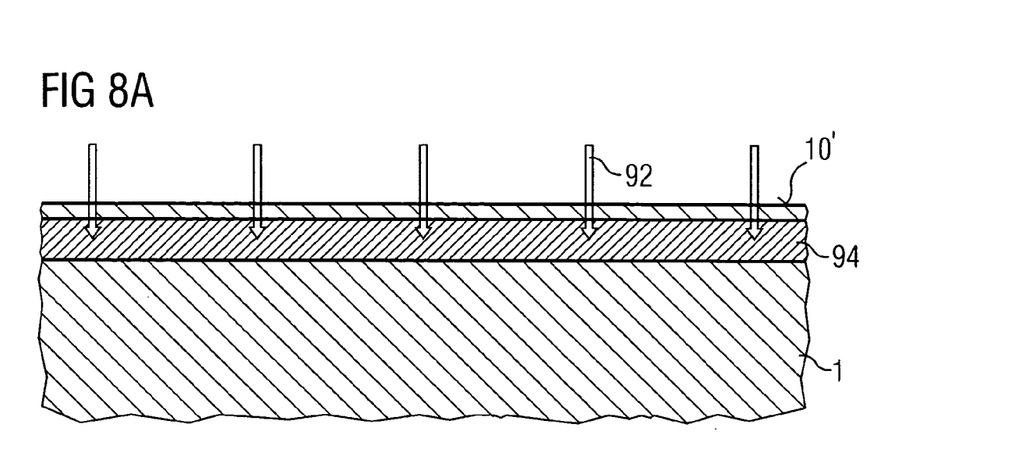
FIGS. 8A to 8C illustrate diagrammatic cross sections through a cell array along a cell row in three stages of a second exemplary embodiment of the method according to the invention.
Figure 8B:
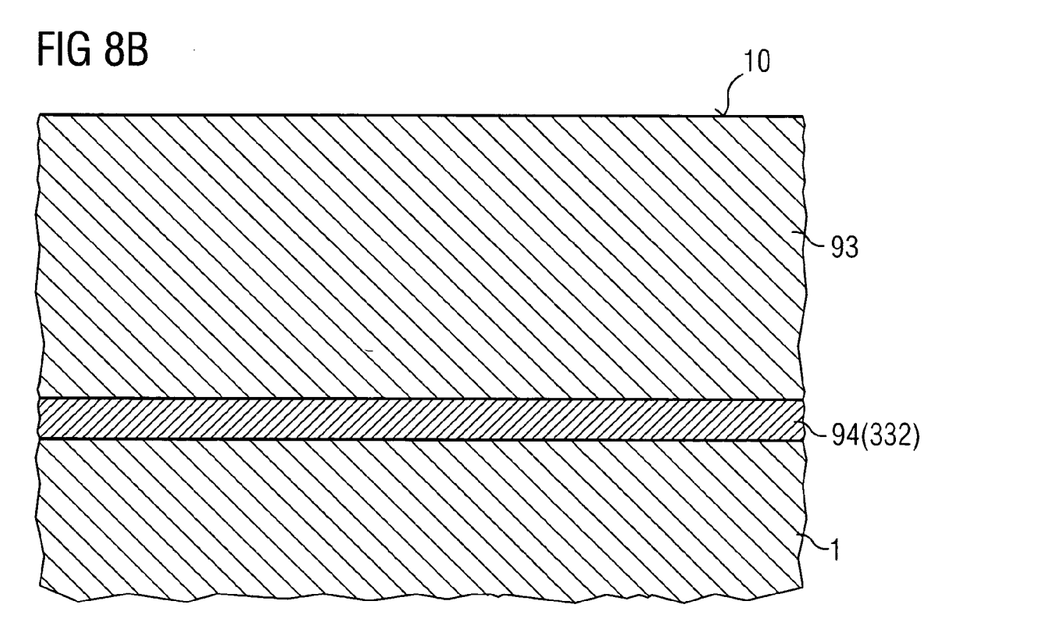
Figure 8C:
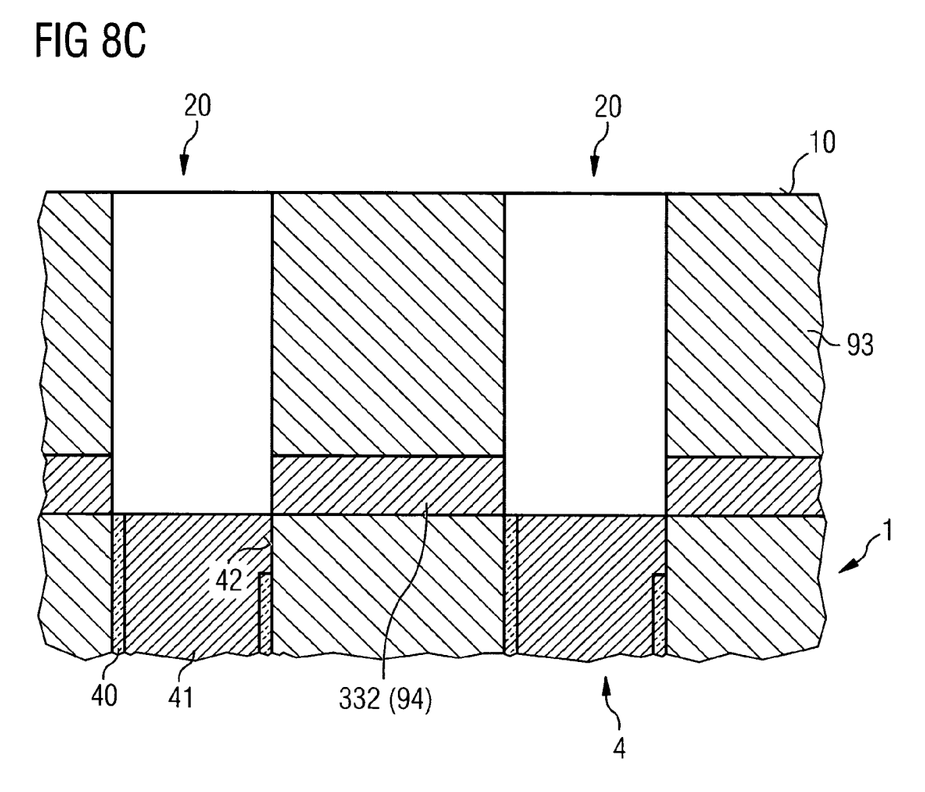

In the second exemplary embodiment for the method according to the invention as illustrated in the drawings of FIG. 8, firstly a shallow implantation 92 with low energy is performed from a provisional substrate surface 10' in the region of the cell array.

As a result, in accordance with FIG. 8A, a precursor layer 94 is formed as an n-doped region in the semiconductor substrate 1. Semiconductor material is grown on the provisional substrate surface 10' by means of an epitaxial method.

FIG. 8B illustrates the epitaxial layer 93 formed by the epitaxial growth. The surface of the epitaxial layer 93 forms the substrate surface 10.

Hole trenches 20 are introduced into the semiconductor substrate 1 which has the precursor layer 94 of the source/drain layer 33 in the region of the cell array. Cell capacitors 4 with an inner electrode 41 are formed in the lower region of the hole trenches 20, the inner electrode 41, in the region illustrated, being insulated by a sidewall insulator 40 from the semiconductor substrate 1 enveloping the hole trench 20. The sidewall insulator 40 is caused to recede on one side, so that the inner electrode 41 adjoins the semiconductor substrate 1 in the region of a contact window 42.

FIG. 8C illustrates the cell array in the state after the formation of the contact window 42 and prior to an outdiffusion of a dopant from the inner electrode 41 or a temporary filling at the place thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A cell array comprising:
   memory cells arranged in a semi-conductor substrate to form cell rows and each having a cell capacitor for storing an electrical charge that characterizes a data content of the memory cell;
   a cell transistor for selection of the memory cell;
   word line trenches arranged between the cell rows and separating the cell rows;
   the cell capacitor being provided in a lower region of a hole trench introduced from a substrate surface of the semiconductor substrate with an inner electrode arranged in the hole trench; and
   the cell transistor being formed in an upper region of the hole trench and having an upper source/drain region, which adjoins the substrate surface and is near the surface, a lower source/drain region, which is connected to the inner electrode of the cell capacitor, and also a channel region, which separates the two source/drain regions from one another and is insulated by a gate dielectric from a gate electrode provided in the word line trenches;
   wherein the lower source/drain regions of the memory cells are formed as doped regions of a first conductivity type and are sections of a buried source/drain layer perforated exclusively by the hole trenches and the word line trenches; and
   wherein a doping profile of the buried source/drain layer parallel to the substrate surface is essentially uniform.

2. The cell array of claim 1, wherein the channel regions and the upper source/drain regions of the cell transistors are formed in an epitaxially grown layer of the semiconductor substrate.

3. The cell array of claim 2, wherein a section of the buried source/drain layer is formed in the epitaxially grown layer of the semiconductor substrate.

4. The cell array of claim 1 further including buried strap diffusion regions that in each case adjoin the inner electrode in the region of a contact window, that are formed as doped regions of the first conductivity type in the semiconductor substrate, and that penetrate the buried source/drain layer in sections.

5. The cell array of claim 4, wherein an upper edge of the lower source/drain region is formed by an upper edge of the buried source/drain layer.

6. The cell array of claim 1, wherein the gate electrodes of memory cells that are adjacent within a cell row are connected to form word lines running along the word line trenches and a lower edge of the word lines is provided above an upper edge of the buried strap diffusion regions and below the upper edge of the buried source/drain layer.

7. The cell array of claim 1, wherein the channel region has a counterdoping of a second conductivity type opposite to the first conductivity type.

8. The cell array of claim 1, wherein the channel regions of the cell transistors are provided in a manner adjoining the substrate surface in sections and are connected to a conductive body connection structure formed above the substrate surface.

9. A cell array comprising:
   memory cells arranged in a semi-conductor substrate to form cell rows and each having a cell capacitor for storing an electrical charge that characterizes a data content of memory cell;
   a cell transistor for selection of the memory cell;

word line trenches arranged between the cell rows and separating the cell rows;

the cell capacitor being provided in a lower region of a hole trench introduced from a substrate surface of the semiconductor substrate with an inner electrode arranged in the hole trench;

the cell transistor being formed in an upper region of the hole trench and having an upper source/drain region, which adjoins the substrate surface and is near the surface, a lower source/drain region, which is connected to the inner electrode of the cell capacitor, and also a channel region, which separates the two source/drain regions from one another and is insulated by a gate dielectric from a gate electrode provided in the word line trenches;

wherein the lower source/drain regions of the memory cells are formed as doped regions of a first conductivity type and are sections of a buried source/drain layer perforated by the hole trenches and the word line trenches; and a body connection plate, which bears on the substrate surface of the cell array and is electrically conductively connected to the channel regions adjoining the substrate surface in sections.

10. The cell array of claim 9, wherein the body connection plate is formed as a layer that covers the cell array, bears on the substrate surface and is perforated by electrically insulated contact holes for the connection of the upper source/drain regions to the bit lines.

11. The cell array of claim 9, wherein the body connection plate is provided from polysilicon and has a doping of a second conductivity type opposite to a first conductivity type of the source/drain regions.

12. The cell array of claim 9, further including body contact diffusion regions formed as doped regions of the second conductivity type in sections of the channel regions adjoining the substrate surface.

13. The cell array of claim 9, further including a nitrided boundary layer between the channel regions and the body connection plate.

* * * * *